United States Patent [19]

Chouan et al.

[11] Patent Number: 5,079,178
[45] Date of Patent: Jan. 7, 1992

[54] PROCESS FOR ETCHING A METAL OXIDE COATING AND SIMULTANEOUS DEPOSITION OF A POLYMER FILM, APPLICATION OF THIS PROCESS TO THE PRODUCTION OF A THIN FILM TRANSISTOR

[75] Inventors: Yannick Chouan, Louannec; Jean-Luc Favennec, Saint Quay Perros, both of France

[73] Assignee: Etat Francais represente par le Ministre des Postes, des Telecommunications l'Espace (Cebtre National d'Etud es des Telecommunications), France

[21] Appl. No.: 448,052

[22] Filed: Dec. 8, 1989

[30] Foreign Application Priority Data

Dec. 19, 1988 [FR] France .................. 88 16737

[51] Int. Cl.$^5$ .................. H01L 21/28; H01L 21/336
[52] U.S. Cl. .................. 437/40; 437/101; 437/228; 156/667; 156/643; 156/646; 204/192.1; 204/192.29; 204/192.3; 204/192.32; 204/192.35
[58] Field of Search .................. 437/41, 101, 228, 229, 437/40; 357/23.7; 427/126.3; 156/643, 646, 663, 667; 204/192.1, 192.29, 192.3, 192.32, 192.35

[56] References Cited

U.S. PATENT DOCUMENTS

| | | | |
|---|---|---|---|
| 3,957,609 | 5/1976 | Sasano et al. | 204/192.35 |
| 3,979,240 | 9/1976 | Ghezzo | 156/667 |
| 4,069,094 | 1/1978 | Shaw et al. | 156/667 |
| 4,093,504 | 6/1978 | Ponjeé et al. | 156/667 |
| 4,336,295 | 6/1982 | Smith | 156/667 |
| 4,390,394 | 6/1983 | Mathuni et al. | 156/667 |
| 4,396,458 | 8/1983 | Platter et al. | 156/667 |
| 4,542,578 | 9/1985 | Yamano et al. | 204/192.35 |
| 4,544,444 | 10/1985 | Chang | 156/667 |
| 4,625,224 | 11/1986 | Nakagawa et al. | 357/23.7 |
| 4,653,858 | 3/1987 | Szydlo et al. | 156/667 |
| 4,654,117 | 3/1987 | Aoki et al. | 156/667 |
| 4,665,008 | 5/1987 | Nishiura et al. | 156/667 |
| 4,670,097 | 6/1987 | Abdalla et al. | 156/667 |
| 4,733,284 | 3/1988 | Aoki | 357/23.7 |
| 4,750,980 | 6/1988 | Hynecek | 204/192.35 |
| 4,778,562 | 10/1988 | Chang et al. | 156/643 |
| 4,797,108 | 1/1989 | Crowther | 437/101 |
| 4,818,981 | 4/1989 | Oki et al. | 340/784 |
| 4,849,797 | 7/1989 | Ukai et al. | 357/23.7 |
| 4,863,557 | 9/1989 | Kokaku et al. | 156/667 |
| 4,878,993 | 11/1989 | Rossi et al. | 204/192.35 |
| 4,948,706 | 8/1990 | Sugihara et al. | 156/667 |

FOREIGN PATENT DOCUMENTS

| | | | |
|---|---|---|---|
| 0275075 | 7/1988 | European Pat. Off. | 357/23.7 |
| 2901930 | 7/1980 | Fed. Rep. of Germany | 156/667 |
| 0053421 | 4/1980 | Japan | 204/192.32 |
| 0004174 | 1/1981 | Japan | 156/667 |

OTHER PUBLICATIONS

Hosokawa et al., "RF Sputter-Etching by Fluor–Chloro-Hydro-Carbons", 6th Int. Vacuum Congress, Mar. 25-29, 1974, p. 27.

Bradshaw et al., "Etching Methods for Indium Oxide/Tin Oxide Films", Thin Solid Films, vol. 33, No. 2, Apr. 1, 1976, pp. L5-L8.

Sasano et al., "Taper Etching of $SnO_2$ Films", J. Vac. Soc. Jpn., vol. 24, No. 12, 1981, pp. 653-659.

(List continued on next page.)

Primary Examiner—Robert Kunemund
Assistant Examiner—M. Wilczewski
Attorney, Agent, or Firm—Pearne, Gordon, McCoy & Granger

[57] ABSTRACT

The process of the invention consists of subjecting a metal oxide coating (106, 108), located on a glass substrate (100), to the action of a gaseous plasma (109) containing 10 to 88% by volume of hydrogen, 2 to 30% by volume of a hydrocarbon and 10 to 50% of an inert vector gas, bringing about the formation of a polymer coating (110) on the parts of the substrate not provided with oxide, by dissocation of the gaseous mixture, and the partial chemical etching of the oxide (106, 108) by the formation of organometallic compounds.

13 Claims, 4 Drawing Sheets

OTHER PUBLICATIONS

Braga et al., "Plasma Etching of SnO$_2$ Films on Silicon Substrates", Thin Solid Films, vol. 73, 1980, pp. L5–L6.

Minami et al., "Reactive Ion Etching of Transparent Conducting Tin Oxide Films Using Electron Cyclotron Resonance Hydrogen Plasma", Jap. J. Appl. Phys., vol. 27, No. 9, Sep. 1988, pp. L1753–L1756.

Henry et al., "Novel Process for Integration of Optoelectronic Devices Using Reactive Ion Etching Without Chlorinated Gas", Electronics Letters, vol. 23, No. 24, Nov. 19th, 1987, pp. 1253–1254.

PROCESS FOR ETCHING A METAL OXIDE COATING AND SIMULTANEOUS DEPOSITION OF A POLYMER FILM, APPLICATION OF THIS PROCESS TO THE PRODUCTION OF A THIN FILM TRANSISTOR

BACKGROUND OF THE INVENTION

1. Field of the Invention

The present invention relates to a process for the anisotropic etching of a metal oxide coating and the simultaneous deposition of a polymer film. It is used in microelectronics and in particular in the production of display circuits for liquid crystal flat screens. The invention in particular makes it possible to produce thin film transistors based on amorphous hydrogenated silicon used in active matrix display screens.

2. Description of the Related Art

The production of thin film transistors (TFT) generally involves the production of an etching of a conductive coating or an insulating coating of metal oxide. This metal oxide etching is generally carried out by the wet technique using a solution containing hydrochloric acid heated to approximately 55° C. The so-called wet methods are limited by their isotropic character, which does not make it possible to obtain well defined etched patterns having micron or submicron dimensions. It is difficult to control this type of etching.

Moreover, during the production of thin film transistors on a glass substrate, the etching of the metal oxide in an hydrochloric acid solution and, in particular, indium and tin oxide (ITO) leads to a partial etching of the glass and the migration of the chlorine ions into the glass substrate. During the production of amorphous hydrogenated siliconbased TFT's in direct contact with the glass, the migration of the chlorine ions into the amorphous silicon modifies the semiconductor properties leading to a deterioration of the electrical properties and to a limited life of such transistors.

Thus, one objective of the invention is to provide a process for etching a metal oxide making it possible to partially eliminate some of these disadvantages.

Moreover, it is known to deposit amorphous hydrogenated carbon films or polymer films on silicon or III-V material substrates by plasma assisted chemical vapour deposition process. Reference is made in this connection to the articles by R. Memming "Properties of polymeric layers of hydrogenated amorphous carbon produced by a plasma-activated chemical vapour deposition process" published in Thin Solid Films, 143, 1986, pp 31-41 and 279-289 and John J. Pouch et al "Plasma deposition of amorphous hydrogenated carbon films on III-V semiconductors" in Thin Solid Films, 157, 1988, pp 97-104 and in FR-A-2 514 743. These polymeric films are generally used as protective materials for optical or electronic components.

Moreover, it is known to etch III-V semiconductor materials by using a mixture of methane, argon and hydrogen from Electronics Letters, November 1987, vol. 23, No. 24, pp 1253-1254 "Novel process for integration of optoelectronic devices using reactive ion etching without chlorinated gas" by L. Henry et al.

In this article, reference is made to the formation of a polymer deposit during the etching of the III-V compounds and it is considered to be an unusable parasitic deposit resulting from an undesined effect and which must necessarily be eliminated in order to produce the intended semiconductor device. Reference is made therein to a number of methods for eliminating this polymeric film.

SUMMARY OF THE INVENTION

Apart from the etching of a metal oxide coating, the invention makes it possible to simultaneously deposit a polymer film more particularly used in the structure of a semiconductor component such as a thin film transistor.

In addition, the inventive process uses, on the same substrate, the selective deposition of a hydrocarbonous polymer associated with the simultaneous etching of a thin metal oxide coating. Thus, this process makes use of the polymer deposit hitherto looked upon as prejudicial in plasma etching processes.

The invention therefore relates to a process for the anisotropic etching of a metal oxide coating by the formation of organometallic compounds located on a substrate and the simultaneous deposition of a polymer film on the substrate parts not provided with oxide and consisting of subjecting the same to a plasma formed from a gaseous mixture containing hydrogen and at least one hydrocarbon which, by dissociation, leads to the formation of the polymer and to said etching by chemically reacting with the oxide coating.

The inventors have found that by adjusting the polarization voltage conditions of the substrate, the pressure, the flow rate of each of the gases and the composition of the gaseous mixture, it is possible to create a perfectly anisotropic chemical etching kinetics for a thin metal oxide coating with speeds of approximately 5 to 10 nm/min.

In particular, it is possible to etch an indium and tin oxide coating with a thickness up to 225 nm with a perfect anisotropy, unlike in the prior art process. This etching process is much less polluting than the wet etching processes and is also easy to control.

The metal oxide coating is etched when the etching conditions permit a chemical reaction between the plasma and the coating to be etched, which leads to the formation of generally volatile organometallic compounds, which are then eliminated by the pumping system of the reactor in which the etching takes place.

Furthermore, under these same conditions, a polymer film is deposited on the substrate outside the areas covered with metal oxide. The deposition rate obtained is approximately 3 to 6 nm/min.

Moreover, the inventors have found that when the metal oxide film is entirely etched, the etching kinetics stops and it is immediately replaced by a deposition kinetics of a polymer film on the then exposed substrate.

The polymer films deposited according to the invention have a certain number of properties. In particular, the growth of these films is perfectly homogeneous over a large surface and independently of the nature of the substrate. For example, the thickness gradient measured on a 330 mm cathode is below 5%. Moreover, the polymeric films have a perfectly smooth surface, a good adhesion to the substrate and a hardness making them difficult to scratch.

The electrical properties of the deposited films and in particular their electrical conductivity, which is below $10^{-10}$ Ohms.cm, ensure that they are excellent electrical insulants.

The deposition/etching pair is linked with the nature of the gas mixture used and also the nature of the thin film to be etched.

In general terms, it is possible to use a large number of hydrocarbon associations which, by dissociation, permit the formation of a polymer deposit and the formation of volatile organometallic compounds by chemical reaction with the oxide coating to be etched.

To ensure that the deposition kinetics and the etching kinetics are of the same order of magnitude, use is made of a gaseous mixture containing, by volume, 10 to 88 and e.g. 45 to 81% hydrogen, 2 to 30 and e.g. 4 to 20% of at least one hydrocarbon and 10 to 50 and e.g. 15 to 35% of an inert vector gas.

In general terms, the hydrocarbons usable in the invention are those of the alkane, alkene and alkyne series, which can be obtained from gas produceres supplying the microelectronics industry. In particular, these hydrocarbons have 1 to 6 carbon atoms. These hydrocarbons can be saturated, unsaturated or aromatic.

Among the hydrocarbons usable within the scope of the invention reference can be made to acetylene, propadiene, ethylene, butene, propylene, methane, ethane, butane, propane, etc. In general, use is made of methane or ethane.

The neutral vector gas, whose function is to bombard the oxide surface to be etched and thus accelerate the formation of volatile organometallic compounds can be a rare gas or nitrogen. The rare gas can be neon, argon, krypton or xenon.

The deposition/etching pair can be obtained in all known plasma etching reactor types, independently of geometrical factors and the pumping units.

In order to move away from an ionic etching system preponderating compared with the deposition and the chemical reaction between the plasma and the metal oxide coating, it is desirable to use an auto-polarization voltage of the substrate, which is proportional to the injected power and below 250 V. Moreover, the preferred pressure range extends from 1.35 to 13.5 kPa (10 to 100 mT).

Numerous metal oxides can be etched by the process according to the invention. The characteristic of these oxides is that their metal can form organometallic compounds. The oxides can be conductive or insulating and can be single or complex.

In particular, the process according to the invention can be used for etching $ZnO$, $WO_3$, $MO_3$, $IrOH$, $SnO_2$, $In_2O_3$, $Ta_2O_5$, or indium and tin oxide (ITO).

The simultaneous deposition and etching process according to the invention is suitable for the production of thin film transistors on an insulating substrate and in particular on a glass substrate. The transistor is produced according to the so-called "stacked with the gate at the top structure" similar to that used for the production of active matrixes for liquid crystal flat screens.

Thus, the invention also relates to a process for the production of a thin film transistor on an insulating substrate and comprising the following steps:

(a) formation on the substrate of the source and drain of the conductive metal oxide transistor, (b) partial anisotropic chemical etching of the metal oxide and simultaneous deposition of a polymer film on the substrate freed from said metal oxide using a plasma formed from a gaseous mixture containing hydrogen and at least one hydrocarbon, said polymer deposition constituting a passivation of the substrate and/or an optical mask beneath the channel of the transistor, (c) successive deposition on the structure obtained in (b) of an amorphous hydrogenated silicon coating, an electrical insulating coating and a conductive coating and (d) photoetching of the stack formed by the silicon coating, the insulating coating and the conductive coating in order to form the transistor gate.

This process has no critical stage. It also makes it possible to passivate the substrate. Thus, in the particular case of a glass substrate, the polymer coating prevents any migration of the ions from the glass, such as sodium, potassium, fluorine, phosphorus and similar ions, entering the composition of the glass, but also impurities such as chlorine ions introduced into the glass during the chemical treatment preceding the polymer deposition. Thus, the electrical properties of the transistor obtained undergo no evolution in time, so that the life thereof is increased. Moreover, it is possible to use glass of a mediocre quality, such as inexpensive soda-lime glass.

As the polymer film is grown very closely along the edges of the metal oxide etched, it is possible to obtain planar structures by adjusting the time during which the substrate is exposed to the plasma, so that the thickness of the deposited polymer and the thickness of the unetched metal oxide are the same. Thus, thickness differences below 10 nm can be obtained.

This leads to a coplanar structure making it possible to deposit in the same plane thin coatings constituting the actual transistor and in particular the amorphous hydrogenated silicon coating. Thus, there is an elimination of all weak points of the structure linked with the passages of steps, which can be a source of defects in transistors.

It is therefore possible to use a very thin amorphous hydrogenated silicon coating (below 20 nm) and thus limit its photoelectric sensitivity.

The active matrixes of thin film transistors produced from amorphous hydrogenated silicon usable in flat screens are sensitive to the light generally used for illuminating these screens. Thus, when this light is intense, a photocurrent is produced in the amorphous silicon coating reducing the contrast of the screen because the Ion/Ioff ratio decreases, Ion and Ioff respectively representing the current supplied by the transistors of a displayed point and a non-displayed point.

In the process according to the invention, the formation of polymer between the source and drain of the transistor and beneath the channel of the latter makes it possible to reduce the photoelectric effect of the amorphous silicon by serving as an optical mask. The polymers deposited according to the invention have a very strong absorption effect in the visible range and this can extend up to 40%.

Moreover, the process according to the invention makes it possible to envisage the complete production of a thin film transistor and the production of other electrical components of a flat screen, such as the addressing rows and columns and the display point electrodes using the dry technique.

It is therefore possible to envisage the deposition and etching of all the thin coatings necessary for the production of a flat screen by plasma processes which, compared with the presently used wet technique, leads to a better definition of the patterns to be etched, as well as improvements with regards to the speed and etching time. This also avoids any detrimental action on the substrate at the end of etching and therefore any occlusion of impurities and in particular chlorine in the substrate. Moreover, a method entirely using the dry technique reduces the costs of producing these screens.

In addition, in liquid crystal devices, it is normal to use polymer coatings deposited by the wet route as liquid crystal orientation coatings. It has been demonstrated that the polymer coating obtained according to the inventive process can serve as an orientation coating of the liquid crystal outside the area of these transistors.

Finally, the polymer deposited can also be used as a passivation coating for the liquid crystal flat screen.

BRIEF DESCRIPTION OF THE DRAWINGS

The invention is described in greater detail hereinafter relative to non-limitative embodiments and the attached drawings, in which.

DESCRIPTION OF THE PREFERRED EMBODIMENT

Figure 1A:
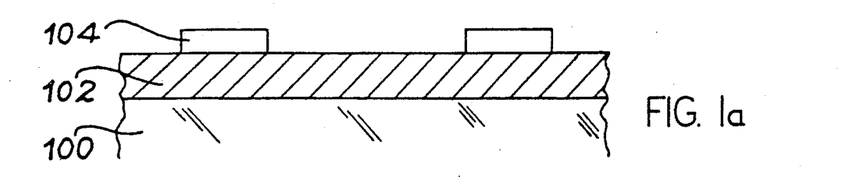
FIGS. 1a through 1f are cross sections showing, the different stages of the process according to the invention applied to the production of a TFT.

The first stage of producing an optically masked TFT consists, as shown in FIG. 1a, of depositing on a glass substrate 100 a 25 to 225 nm thick ITO coating 102, which is deposited by vacuum magnetron sputtering.

With the aid of a first resin photomask 104, defining the location of the source and drain of the transistor to be produced, a first etching of coating 102 takes place in an hydrochloric acid bath. This bath contains 37% of hydrochloric acid diluted to 50% in water and raised to a temperature of approximately 55° C.

In a process entirely involving the dry technique, said chemical etching is carried out with a mixture of $CH_4+H_2+Ar$ with volume percentages of 10 for $CH_4$, 72 for $H_2$ and 18 for Ar.

Figure 1B:
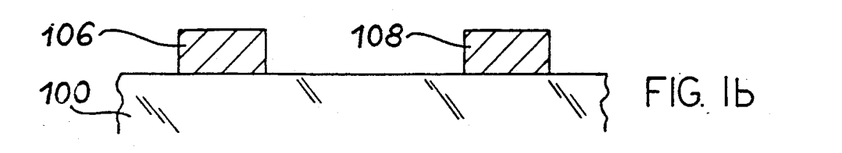

Following the elimination of mask 104 by an oxygen plasma, the structure shown in FIG. 1b is obtained. The oxide contacts 106 and 108 will respectively constitute the source and drain of the transistor.

Figure 1C:
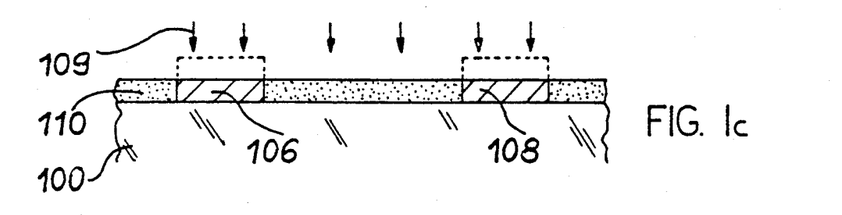

The complete sample is then exposed to a $CH_4+H_2+Ar$ plasma 109, as shown in FIG. 1c. This leads to a partial etching of the source and drain contacts 106 and 108 of the transistor and to the deposition of a polymer film 110 on all the surfaces of the substrate not covered with metal oxide. The organometallic compounds formed are of the trimethyl indium $I_4(CH_3)_3$ and tetramethyl tin $Sn(CH_3)_4$ types.

For an autopolarization voltage of the substrate of 100 to 240 V, a pressure of 13.56 MHz, a pressure of 60 mT (8 kPa) and gas flow rates of $CH_4=7$ cm$^3$/min, $H_2=50$ cm$^3$/min and Ar$=12$ cm$^3$/min, an ITO etching speed of 6 nm/min is obtained and a polymer deposition speed of 4 nm/min. These gas flows correspond to a gaseous mixture of 10% $CH_4$, 72% of hydrogen and 18% of argon by volume.

With a 125 nm ITO coating 102, a planar structure is obtained, the etched ITO height being equal to the polymer height 110 deposited, to within 10 nm.

Figure 1D:
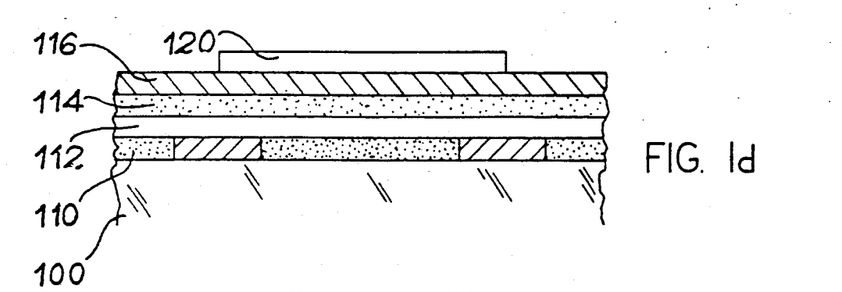

As shown in FIG. 1d, transistor production continues with the deposition of an amorphous hydrogenated silicon coating 112 on the complete structure, followed by a silicon nitride coating 114 and an aluminium silicide or aluminium coating 116. Coatings 112 and 114 are obtained by plasma-assisted chemical vapour phase deposition and the aluminium coating 116 is deposited by evaporation or sputtering. Coatings 112, 114 and 116 have respective thicknesses of 20, 240 and 200 nm.

Figure 1E:
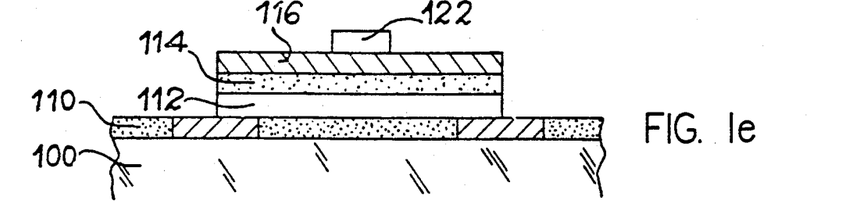

This is followed by the definition of the dimensions of the transistor with the aid of a resin photomask 120 produced by known processes. This is followed by dry anisotropic etching of coatings 114 and 112 and wet etching of coating 116. The etching agents are respectively a sulphur hexafluoride plasma ($SF_6$) for coatings 114 and 112 and an orthophosphoric acid bath for coating 116. The structure obtained is shown in FIG. 1e.

Figure 1F:
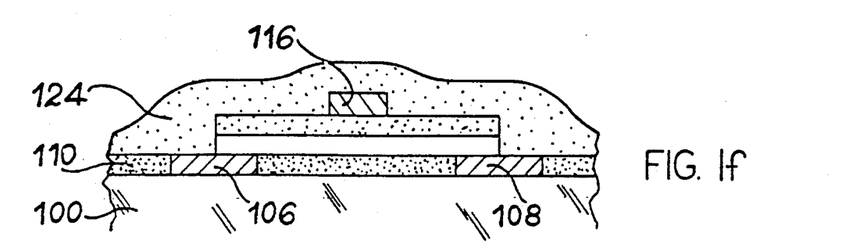

Following the elimination of the resin mask 120, it is optionally possible to form a photomask 122 defining the dimensions of the transistor gate. Using mask 122, coating 116 is then obtained by wet etching. Following the elimination of mask 122 by an oxygen plasma, the complete structure is passivated by depositing a silicon nitride coating 124, as shown in FIG. 1f.

In the case of a conductive metal oxide (particularly ITO) coating 116, it is possible to use the inventive process for etching coating 116 and simultaneously forming the passivation coating 124 of the transistor.

Figure 2A:
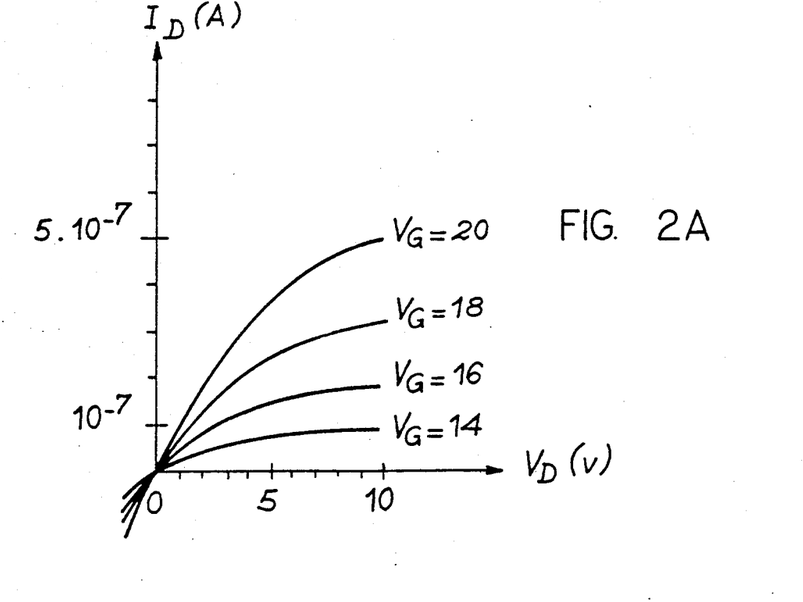
FIGS. 2a and 2b show the static characteristics of a transistor obtained by the inventive process.
Figure 2B:
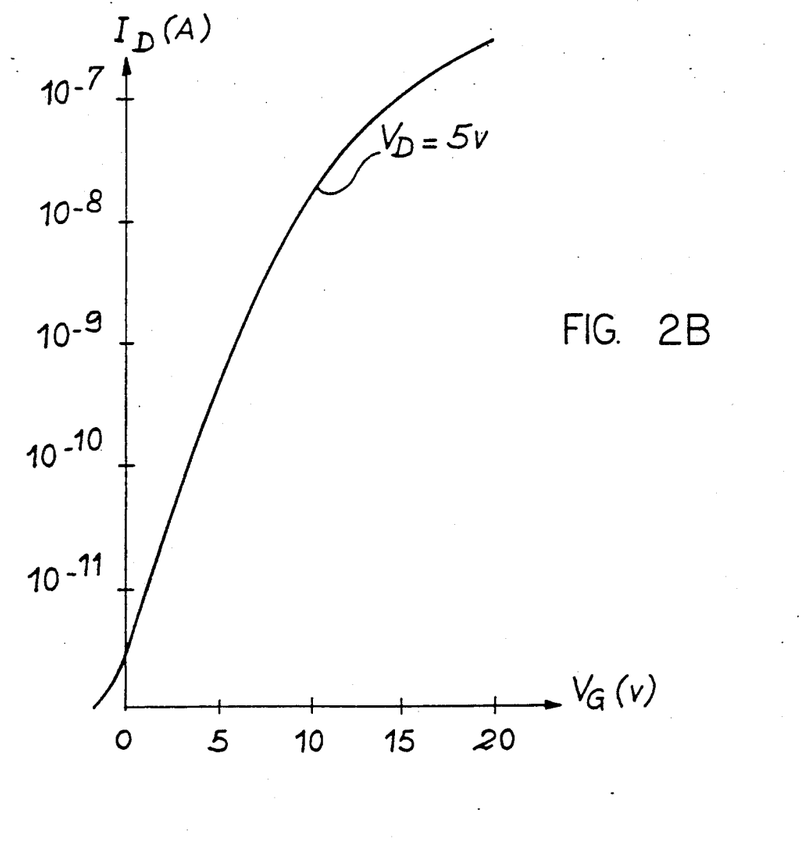

The static electrical characteristics of the transistor obtained are shown in FIGS. 2a and 2b are established for a source and drain etched by the wet route. The curves of FIG. 2a show the variations of the drain current ($I_D$) expressed in amperes as a function of the drain voltage ($V_D$) expressed in volts for different voltages applied to the transistor gate ($V_G$). FIG. 2b shows the variations of the drain current in amperes as a function of the gate voltage applied for a drain voltage of 5 V.

Figure 3A:
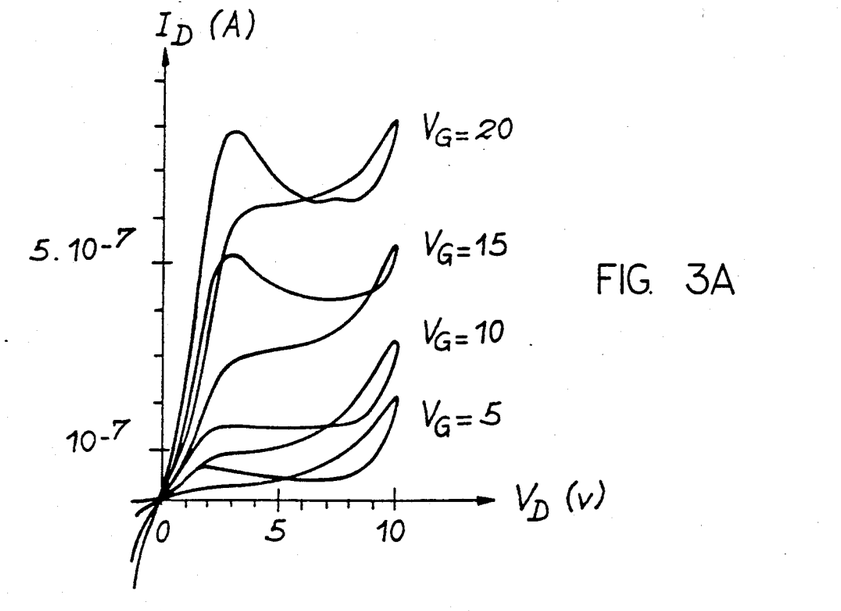
FIGS. 3a and 3b show the characteristics of a transistor produced under conditions strictly identical to those of the invention, but which has not undergone the etching and deposition process according to the invention.
Figure 3B:
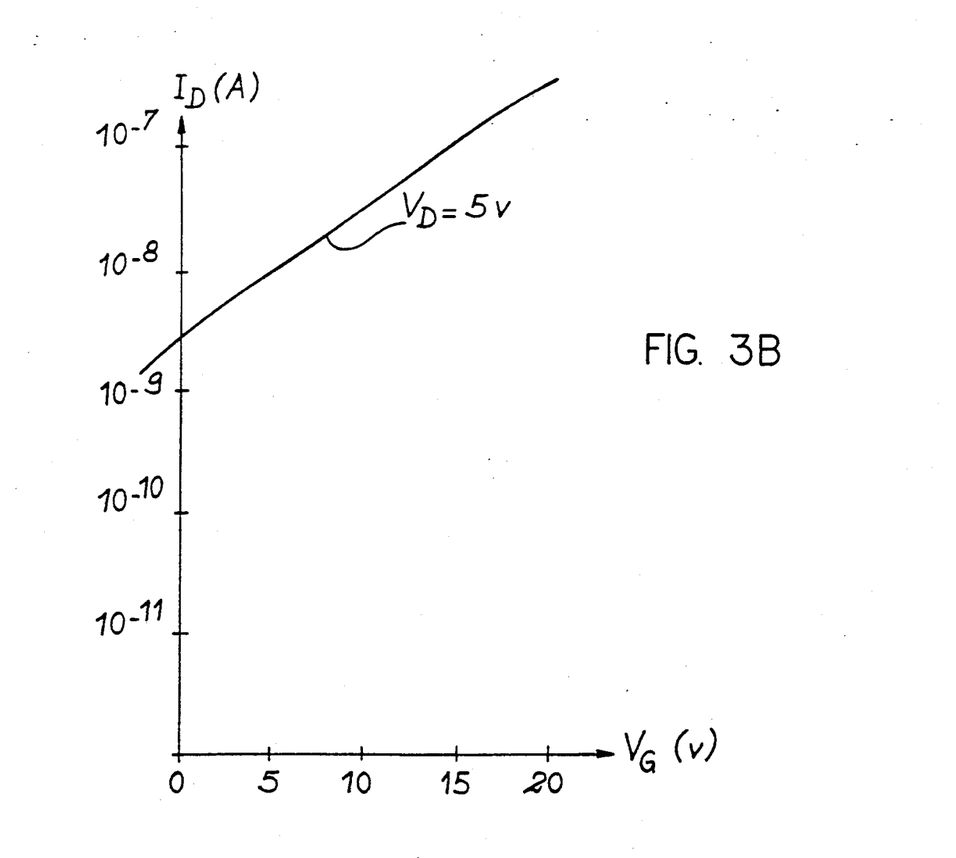

For comparison purposes, FIGS. 3a and 3b show the static electrical characteristics of a transistor produced under the same conditions as hereinbefore, with the exception of the simultaneous ITO etching and polymer deposition according to the invention. FIG. 3a shows the variations of $I_D$ as a function of $V_D$ for different gate voltages $V_G$ and FIG. 3b shows the variations of $I_D$ as a function of $V_G$ for a drain voltage of 5 V.

These curves clearly show the effectiveness of the polymer deposition as a glass passivation coating, serving as a barrier to the diffusion of the impurities contained in the glass towards the semiconductor coating of the transistor, whilst the physical properties of the ITO are retained following plasma etching, there being no deterioration to the ITO/amorphous hydrogenated silicon contact.

Moreover, with the process according to the invention, a relatively effective optical mask of the transistor is obtained. An absorption of approximately 20% with a wavelength of 560 nm was measured for 50 nm thick polymer films.

The process described with reference to FIGS. 1a to 1f is compatible with the process for producing an active matrix display screen described in EP-A-0 103 523 and in FR-A-2 571 893 of the present Applicant.

Figure 4:
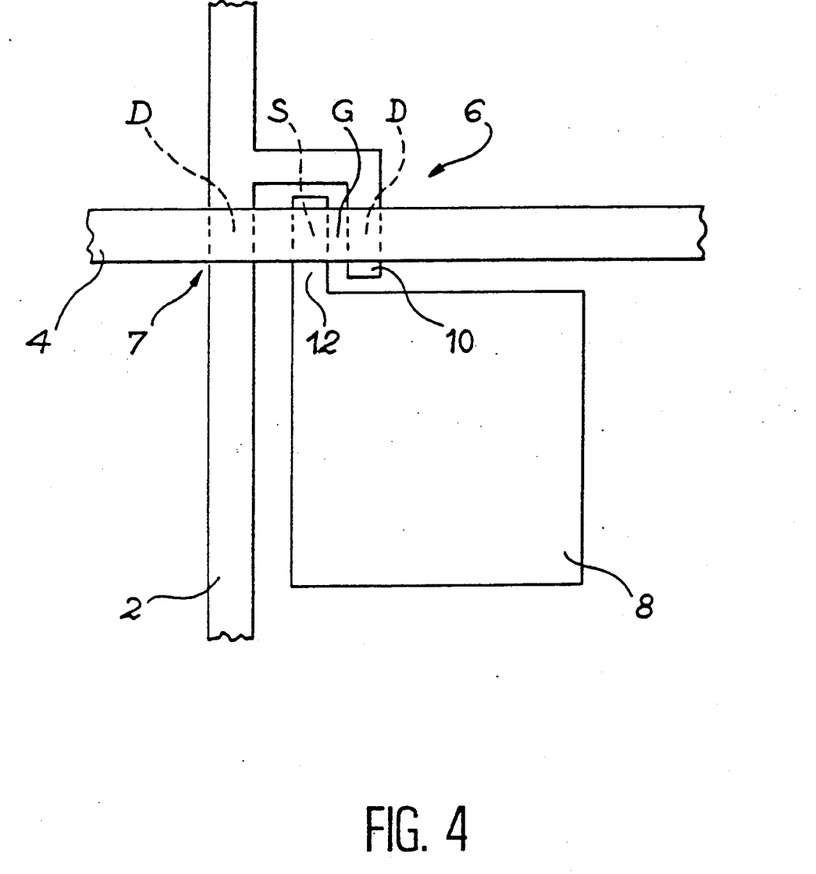
FIG. 4 is a plan view of a point of an active matrix of a flat screen.

In such an active matrix display screen, each point of the matrix has the structure shown in plan view in FIG. 4. It is possible to see a conductive column 2 and a conductive row 4 constituting the addressing columns and rows of the memory points of the active matrix, two parallel-connected TFT's 6, 7 and a transparent electrode 8 constituting one of the armatures of the elementary display points (pixels) of the active matrix. The TFT's are produced in the manner described hereinbefore.

Each column 2 is provided with a member 10 and each electrode 8 with a finger 12. The intersections of row 4 and column 2 and member 10 define the drains D of the thin film transistors and the intersection of the row 4 and the finger 12 defines the source of said transistors. The part of row 4 between column 2 and member 10 constitutes the gate G of the transistors.

During the production of a complete display screen, the mask 104 for defining the location of the source and drain of the TFT's 6 and 7 also serves as a mask for the transparent electrode 8 and the conductive columns 2 of the screen to be produced. The armatures 8 and columns 2 are then formed at the same time as the source and drain contacts by wet route etching of the ITO coating 102, or by dry route etching and then etching by the process according to the invention of the said same coating 102. The spaces between the armatures and the columns are then covered with the polymer 110 according to the invention.

Moreover, the addressing rows of the display screen are formed simultaneously with the transistor gate by etching the coating 116 once with the aid of the mask 20 and a second time with the aid of mask 122.

We claim:

1. Process for the anisotropic etching of a patterned metal oxide coating (102) by the formation of organametallic compounds located on a substrate (100) and the simultaneous deposition of a polymer film (110) on the parts of the substrate not provided with oxide and consisting of subjecting the complete entity to a plasma formed from a gaseous mixture containing hydrogen and at least one hydrocarbon which, by dissocation, leads to the formation of the polymer (110) and to said etching by chemically reacting with the oxide coating.

2. Process according to claim 1, characterized in that the gaseous mixture contains by volume 10 to 88% hydrogen, 2 to 30% of at least one hydrocarbon and 10 to 50% of at least one inert vector gas.

3. Process according to claim 1, characterized in that the gaseous mixture contains by volume 45 to 81% hydrogen, 4 to 20% of at least one hydrocarbon and 15 to 35% of at least one inert vector gas.

4. Process according to claim 1, characterized in that the hydrocarbon is methane.

5. Process according to claim 1, characterized in that the gaseous mixture contains argon.

6. Process according to claim 1, characterized in that the gaseous mixture contains 72% hydrogen, 10% methane and 18% argon.

7. Process according to claim 1, characterized in that the gaseous mixture has a pressure from 1.35 to 13.5 kPa.

8. Process according to claim 1, characterized in that a polarization voltage of substrate (100) below 250 V is used.

9. Process according to claim 1, characterized in that the oxide coating (102) is formed from a transparent, electric conductive material chosen from among ITO, $SnO_2$ and $In_2O_3$.

10. Process according to claim 1, characterized in that the substrate is a transparent insulating material.

11. Process for the production of a thin film transistor on an insulating substrate (100) comprising the following steps:
    (a) formation on a substrate (100) of a source (106) and a drain (108) of the transistor consisting of a conductive metal oxide (102),
    (b) partial anisotropic chemical etching of the metal oxide and simultaneous deposition of a polymer film (110) on portions of the substrate on which said metal oxide is not formed by subjecting the complete entity to a plasma formed from a gaseous mixture containing hydrogen and at least one hydrocarbon which by dissociation leads to the formation of the polymer, said polymer deposit constituting a passivation of the substrate (100) and/or an optical mask beneath the transistor channel,
    (c) successive depositions on the substrate obtained in (b) of an amorphous hydrogenated silicon coating (112), an electrically insulating coating (114) and a conductive coating (116) and
    (d) photoetching the conductive coating to form the transistor gate.

12. Process according to claim 11, characterized in that steps (a) to (d) are performed by the dry etching technique.

13. Process according to claim 11, characterized in that the deposited polymer thickness and the metal oxide thickness left after etching are equal so as to obtain a transistor with a planar structure.

* * * * *

UNITED STATES PATENT AND TRADEMARK OFFICE
CERTIFICATE OF CORRECTION

PATENT NO. : 5,079,178
DATED      : January 7, 1992
INVENTOR(S) : Yannick Chouan; Jean-Luc Favennec It is certified that error appears in the above-identified patent and that said Letters Patent is hereby corrected as shown below:

Column 1, line 35, "siliconbased" should be --silicon-based--.

Column 2, line 38, "etching" should be --route--.

Column 2, line 56, "independently" should be --independent--.

Column 7, lines 32-33, "organametallic" should be --organometallic--.

Signed and Sealed this

Twenty-second Day of June, 1993

Attest:

MICHAEL K. KIRK

Attesting Officer *Acting Commissioner of Patents and Trademarks*